(12) United States Patent
Sato

(10) Patent No.: US 7,689,968 B2
(45) Date of Patent: Mar. 30, 2010

(54) PROXIMITY EFFECT CORRECTION WITH REGARD TO A SEMICONDUCTOR CIRCUIT DESIGN PATTERN

(75) Inventor: Shunichiro Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 376 days.

(21) Appl. No.: 11/673,156

(22) Filed: Feb. 9, 2007

(65) Prior Publication Data

US 2008/0178141 A1    Jul. 24, 2008

(30) Foreign Application Priority Data

Feb. 17, 2006   (JP)   ............ P2006-040414

(51) Int. Cl.
*G06F 17/50*    (2006.01)
(52) U.S. Cl. ............... 716/19; 716/4; 716/5; 716/20; 716/21
(58) Field of Classification Search ............ 716/4, 716/5, 19–21; 382/145; 430/5, 30
See application file for complete search history.

(56) References Cited

U.S. PATENT DOCUMENTS

2005/0148195 A1* 7/2005 Koehle et al. ............... 438/709
2006/0269121 A1* 11/2006 Yamaguchi et al. ......... 382/145
2008/0014509 A1* 1/2008 Hsu et al. .................... 430/5

FOREIGN PATENT DOCUMENTS

| JP | 2004-061720 | 2/2004 |
| JP | 2005-055563 | 3/2005 |

* cited by examiner

*Primary Examiner*—Vuthe Siek
(74) *Attorney, Agent, or Firm*—Sonnenschein Nath & Rosenthal LLP

(57) ABSTRACT

A pattern correction apparatus for performing both of optical proximity effect correction and process proximity effect correction with regard to a design pattern includes: a correction calculation means configured to perform correction calculation by two-dimensional model-based optical proximity effect correction for each of sampling points set on pattern edges which form the design pattern; the correction calculation means performing the correction calculation which involves weighting with a two-dimensional distribution of the pattern edges around the sampling point taken into consideration; the weighting being performed such that a high weight is applied to a region in which reaction products which can have an influence on the sampling point are produced but a low weight is applied to any other region.

8 Claims, 8 Drawing Sheets

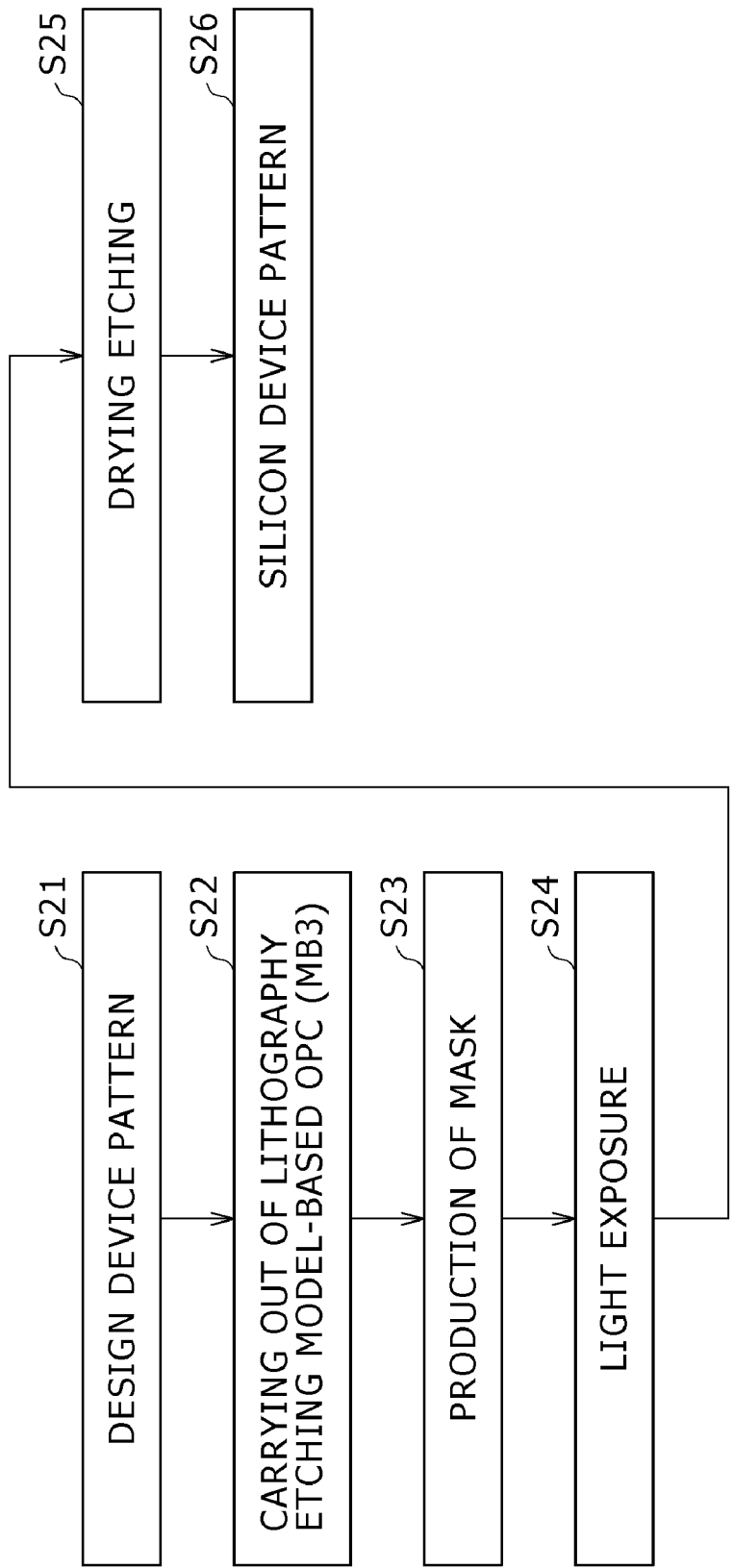

PROXIMITY EFFECT CORRECTION WITH REGARD TO A SEMICONDUCTOR CIRCUIT DESIGN PATTERN

CROSS REFERENCES TO RELATED APPLICATIONS

The present invention contains subject matter related to Japanese Patent Application JP 2006-040414 filed with the Japanese Patent Office on Feb. 17, 2006, the entire contents of which being incorporated herein by reference.

BACKGROUND OF THE INVENTION

1. Field of the Invention

This invention relates to a pattern correction apparatus, a pattern correction program, a pattern correction method and a fabrication method for a semiconductor device which are utilized in a fabrication process of a semiconductor device.

2. Description of the Related Art

In recent years, as a result of progress of the generation of the basic size of semiconductor devices to that later than the 65-nm generation, the magnitude of the dispersion of the pattern size, the distortion of the shape and so forth which are caused by an influence of proximity effects cannot be ignored any more. Such proximity effects include not only an optical proximity effect which occurs in an optical exposure transfer step but also a process proximity effect which occurs in various semiconductor lithography steps after formation of a resist pattern such as a resist slimming step, a dry etching step and a CMP (Chemical Mechanical Polishing) step. However, under present conditions, while an established highly accurate dimensional correction technique called OPC (Optical Proximity effect Correction) is available against the optical proximity effect, a highly accurate dimensional correction technique applicable to individual steps is not established as yet against the process proximity effect.

For correction calculation of the OPC, two OPC methods are available including a rule-base OPC method and a model-based OPC method. According to the rule-base OPC method, correction calculation is carried out using a one-dimensional dimension such as a pattern line width, a space width or the like of an inputted design pattern as an argument. Meanwhile, according to the model-based OPC, correction calculation is carried out based on a two-dimensional area distribution of peripheral patterns. Although the latter may require longer calculation time than the former, it provides a higher degree of accuracy in dimensional correction because it executes precise calculation. Therefore, for a layer for which the highest degree of accuracy in dimension may be required in a semiconductor circuit such as, for example, a gate layer, selective use of the model-based OPC is increasing in order to perform correction against the optical proximity effect. A related technique is disclosed, for example, in Japanese Patent Laid-Open No. 2004-61720 and Japanese Patent Laid-Open No. 2005-55563.

On the other hand, as regards the process proximity effect, a correlation between the trend of the dimensional dispersion caused by the effect and the two-dimensional area distribution of peripheral patterns is not grasped sufficiently. Therefore, under present conditions, rule-based one-dimensional OPC correction is frequently carried out alternatively based on a corresponding relationship between the level of the line width, space width and so forth of a test pattern and CD (Critical Dimension) measurement values.

SUMMARY OF THE INVENTION

Incidentally, for a design pattern based on which a desired semiconductor circuit pattern is to be formed, it is preferable to perform both of correction against the optical proximity effect and correction against the process proximity effect. Where correction against both of the optical proximity effect and the process proximity effect is to be performed, according to the related art technique described above, the rule-base OPC for performing correction against the process proximity effect and the model-based OPC for compensating for the optical proximity effect are executed individually and successively. Therefore, if the design pattern is for a large scale integrated circuit pattern, then there is the possibility that the problem of increase of the calculation time may occur.

From such a situation as described above, it has been attempted recently to suitably modify a correction parameter of the model-based OPC so that correction not only against the optical proximity effect but also against the process proximity effect can be performed thereby to carry out dimensional correction of the design pattern by the sole model-based OPC. This is because, since the model-based OPC involves investigation of a two-dimensional area distribution of peripheral patterns and correction based on the two-dimensional area distribution, if the correction parameter is optimized sufficiently, then it can be expected that sufficient correction accuracy can be obtained also against the process proximity effect.

However, it is clear that, if it is tried to compensate for the process proximity effect solely by the model-based OPC, then even if optimization calculation of the correction parameter is repeated by any number of times, the correction parameter does not converge until sufficient correction accuracy can be obtained. It is considered that this is caused by the fact that the correction function of the model-based OPC is originally produced in order to correct the optical proximity effect and is not necessarily made so that the process proximity effect can be corrected. Particularly, it is estimated that, if the basic dimension of a circuit pattern decreases as a result of progress of enhancement of integration of a semiconductor circuit, then estrangement between the correction function and the optical proximity effect increases, and this makes it more difficult to obtain sufficient correction accuracy. Accordingly, in order to perform correction against both of the optical proximity effect and the process proximity effect simultaneously with a high degree of accuracy using the model-based OPC, it is not sufficient to merely optimize the correction parameter, but it is considered necessary to modify the correction function against the optical proximity effect at present or add a new correction function for performing correction against the process proximity effect with a high degree of accuracy to the model-based OPC.

Thus, it is demanded to provide a pattern correction apparatus, a pattern correction program, a pattern correction method and a fabrication method for a semiconductor device by which a dimensional dispersion, a distortion in shape and so forth of a semiconductor circuit pattern which arise from an optical proximity effect and a process proximity effect can be corrected simultaneously with a high degree of accuracy through two-dimensional correction calculation solely by the model-based OPC.

According to an embodiment of the present invention, there is provided a pattern correction apparatus for performing both of optical proximity effect correction and process proximity effect correction with regard to a design pattern, including correction calculation means configured to perform correction calculation by two-dimensional model-based optical proximity effect correction for each of sampling points set on pattern edges which form the design pattern, the correction calculation means performing the correction calculation which involves weighting with a two-dimensional distribution of the pattern edges around the sampling point taken into consideration, the weighting being performed such that a high weight is applied to a region in which reaction products which can have an influence on the sampling point are produced but a low weight is applied to any other region.

In the pattern correction apparatus, the correction calculation means which performs correction calculation by two-dimensional model-based correction (OPC) against the optical proximity effect performs the correction calculation which involves weighting with a two-dimensional distribution of pattern edges around a sampling point taken into consideration. In particular, the correction calculation means performs the weighting such that a high weight is applied to a region in which reaction products which can have an influence on the sampling point are produced but a low weight is applied to any other region in order to perform correction calculation. Accordingly, even if different pattern edges are located at an equal distance from the sampling point, different weights may be applied to the pattern edges depending upon the situation of the two-dimensional distribution of the pattern edges. In other words, even when correction calculation by the two-dimensional model-based OPC is performed, by introduction of the weighting with the pattern edge distribution taken into consideration, the flexibility can be provided to the influence degree from a pattern edge or a region located at the same distance from the sampling point. Accordingly, optimization of a correction parameter for correcting a dimensional dispersion of patterns, shape distortion and so forth by a process proximity effect such as, for example, an etching work conversion difference, which is difficult to achieve using correction calculation in the past based on model-based OPC, can be achieved.

With the pattern correction apparatus, correction against both of an optical proximity effect and a process proximity effect can be performed simultaneously and with a high degree of accuracy by the two-dimensional model-based OPC. Therefore, even if a design pattern is for a large scale integrated circuit pattern, the long period of time necessary for correction calculation can be eliminated.

More particularly, since process proximity effect correction is carried out by the two-dimensional model-based OPC while weighting with a situation of a two-dimensional distribution of pattern edges into consideration is introduced, correction calculation with a high degree of accuracy can be anticipated when compared with a case in the past wherein rule-based process proximity effect correction is carried out based on one-dimensional dimensions such as a line width and a space width. Further, since optical proximity effect correction and process proximity effect correction can be carried out simultaneously using a single model-based OPC calculation expression, also reduction of the calculation time can be anticipated when compared with an alternative case wherein rule-base optical proximity effect correction and model-based optical proximity effect correction are carried out successively as in the related art.

In summary, since the pattern correction is carried out, a higher degree of accuracy of formation dimensions of a semiconductor circuit pattern can be anticipated and hence enhancement of the yield in semiconductor fabrication can be anticipated. Further, since a correction process for the pattern correction can be executed at a higher speed, also decrease of the time for delivery of products can be anticipated. Furthermore, two-dimensional correction and management of a final shape, dimensions and so forth of a semiconductor circuit pattern can be implemented readily, and consequently, also enhancement of basic performances of a semiconductor circuit such as reduction of leak current can be anticipated.

BRIEF DESCRIPTION OF THE DRAWINGS

FIG. 8 is a flow chart illustrating a particular example of a fabrication method for a semiconductor device to which the present invention is applied.

DETAILED DESCRIPTION OF THE PREFERRED EMBODIMENT

In the following, a pattern correction apparatus, a pattern correction program, a pattern correction method and a fabrication method for a semiconductor device to which the present invention is applied are described with reference to the drawings.

First, an outline of the present invention is applied.

The present invention has been made it possible for a dimensional dispersion, a distortion in shape and so forth of a semiconductor circuit pattern which arise from an optical proximity effect and a process proximity effect to be corrected simultaneously with a high degree of accuracy through two-dimensional correction calculation solely by the model-based OPC. In other words, both of correction against the optical proximity effect and correction against the process proximity effect are performed for a design pattern based on which a semiconductor circuit pattern is to be formed.

Therefore, paying attention to a dry etching step from within a semiconductor lithography process after an optical exposure transfer process, the inventors of the present invention conducted a research and an experiment regarding a correlation between the variation in dimension (etching work conversion difference) of various test patterns before and after the dry etching step and the peripheral pattern area distribution of the test patterns. As a result, it was found out that, while it is a generally known fact that, at the dry etching step, a phenomenon that reaction products produced by a plasma electrochemical reaction between etching particles and an etched material stick to a side wall of a pattern and form a side wall protective film occurs, a dispersion occurred in the dimensional variation of the various patterns in response to the thickness of the side wall protective film. This is disclosed, for example, in MAEGUCHI et al., "The Innovation of the Logic LSI Technology", Science Forum, 1995, pp. 185 to 186. In other words, if the side wall protective film is thick, then the etching of the side wall in the horizontal direction is suppressed thereby to reduce the etching work conversion difference, but on the contrary if the side wall protection film is thin, then the etching of the side wall in the horizontal direction is suppressed thereby to increase the etching work conversion difference. Accordingly, in order to implement high accuracy correction suitable for the dry etching step, it is necessary to introduce a correction function based on the correlation between the thickness of the side wall protective film and the peripheral pattern area distribution.

Figure 1A:
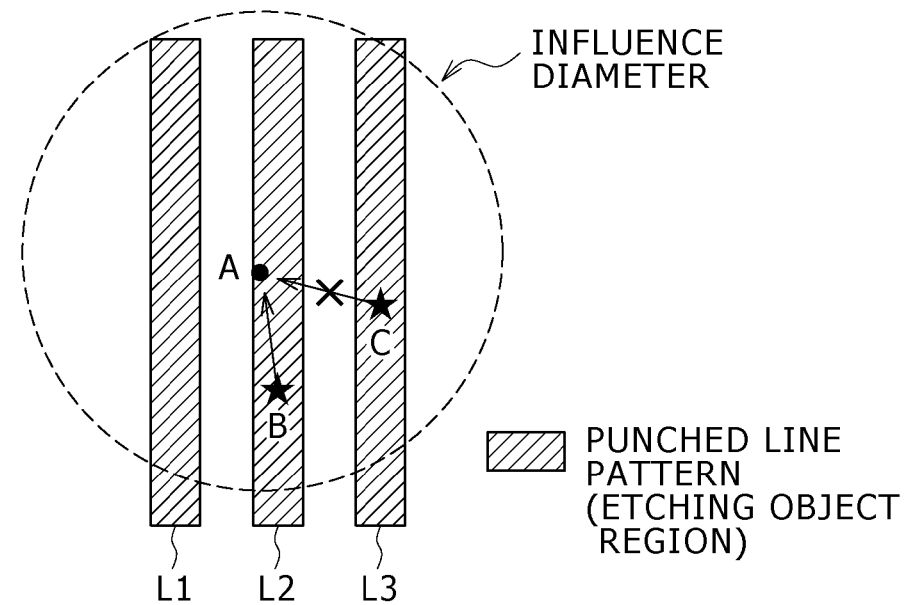
FIGS. 1A and 1B are schematic views showing a particular example of a punched line pattern of a metal layer or the like to be used to form a semiconductor circuit.
Figure 1B:
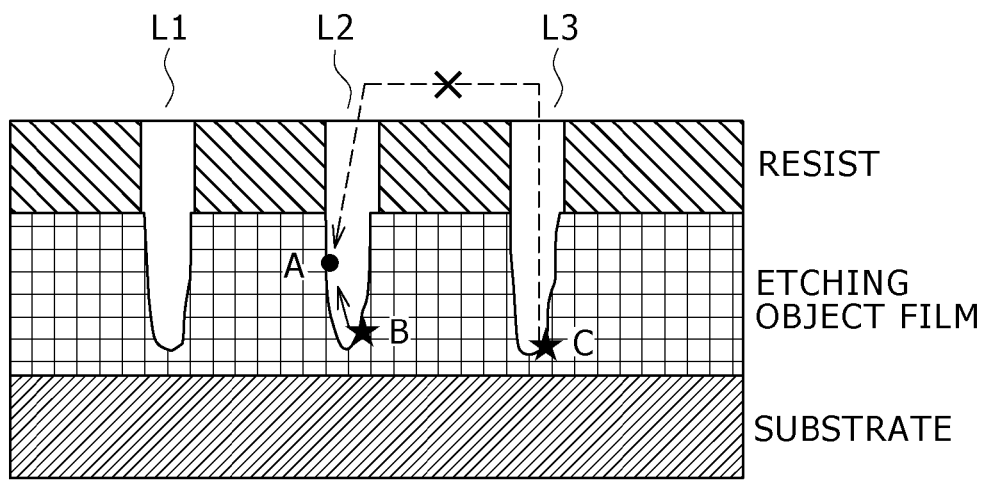

This is described with reference to particular examples. FIGS. 1A and 1B illustrate a particular example of a punched line pattern of a metal layer or the like which composes a semiconductor circuit. FIGS. 1A and 1B schematically illustrate a manner that etching reaction products upon etching of a line-and-space (hereinafter referred to simply as "LS") pattern, which three lines are disposed adjacently, stick to pattern side walls. Referring to FIGS. 1A and 1B, if attention is paid to a point A of a side wall of the central punched line L2, then it is considered that reaction products produced at a point B of the central punched line L2 are scattered into and move the space in the central punched line L2 etched already until they come and stick to the point A with a high probability. On the other hand, in order for reactive products generated at a point C of the adjacent punched line L3 to stick to the point A, it is necessary to first escape from the punched line L3 once into a plasma sheath region vertically above a substrate and then diffuse by re-collision with incoming etching particles or the like to change the moving direction thereof until they advance into the inside of the central punched line L2 again. Therefore, it is to be noted that the probability that the reaction products produced at the point C may come and stick to the point A is considered to be low. In other words, although the distances from the point A to the points B and C are substantially equal to each other, the degree of influence upon the etching work conversion difference of the point A is higher from the point B than from the point C.

However, according to the model-based OPC in the past, an argument of a dimensional correction function value at each sampling point is calculated by multiplying a peripheral pattern area distribution by an integral kernel. Therefore, correction calculation is executed assuming that the degrees of influence upon locations to which the distances are equal from a sampling point are equal to each other. Therefore, even if it is tried to utilize the model-based OPC in the past in order to correct an etching work conversion difference, optimization calculation of a correction parameter does not converge.

Therefore, when a dimensional correction value at each sampling point is to be calculated according to the model-based OPC, it is a possible idea not to perform weighting depending upon the distance to a peripheral pattern but to additionally introduce weighting with a two-dimensional distribution of pattern edges into consideration. In particular, when correction calculation according to the two-dimensional model-based OPC is to be performed for each of sampling points set on pattern edges which construct a design pattern based on which a semiconductor circuit pattern is to be formed, the correction calculation is performed introducing weighting with a two-dimensional distribution of pattern edges around the sampling point taken into consideration. The weighting at this time should be performed such that a high weight is applied to a region in which reaction productions which can have an influence on the sampling point are produced while a low weight is applied to any other region.

Figure 2:
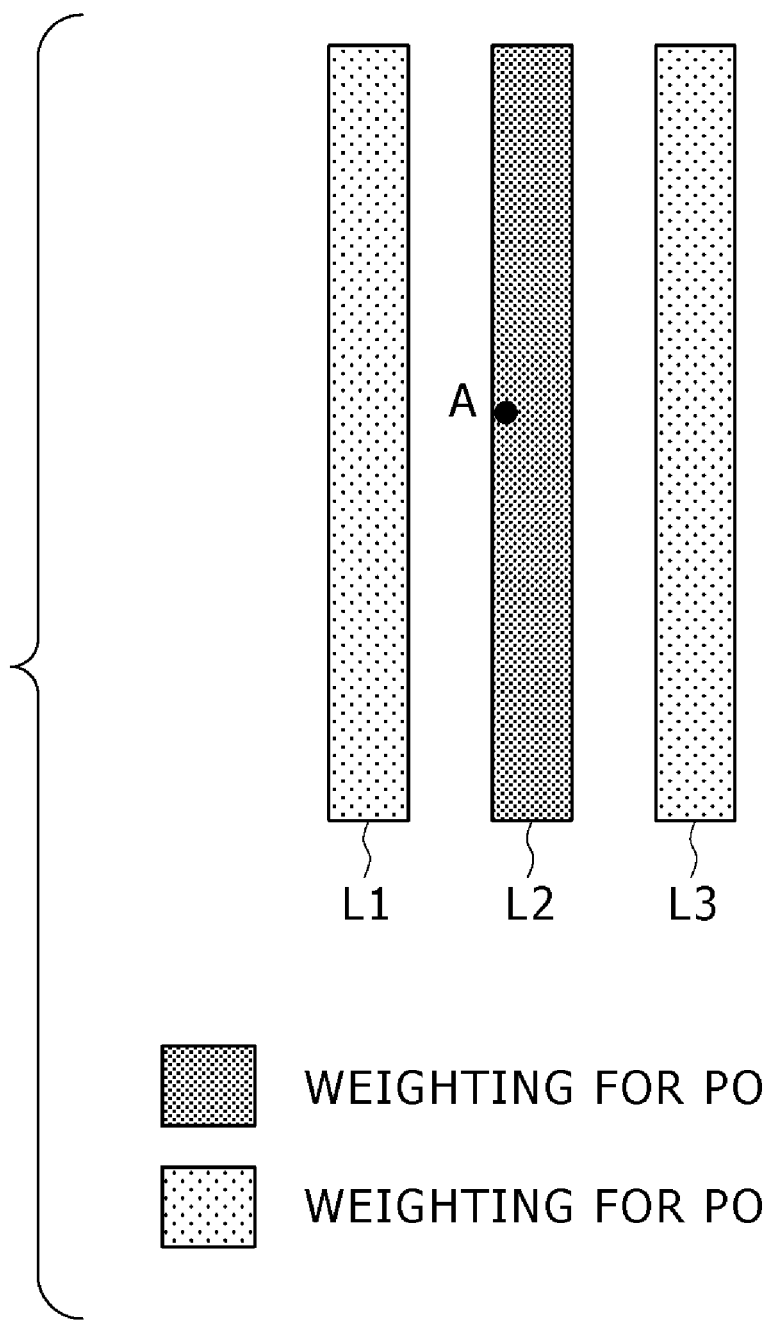
FIG. 2 is a schematic view illustrating an outline of weighting for the punched line pattern of FIGS. 1A and 1B.

FIG. 2 illustrates a particular example of an outline of the weighting. In particular, FIG. 2 illustrates an example of weighting corresponding to the three-LS pattern of FIGS. 1A and 1B. In the case of the three-LS pattern, if the point A is selected as a sampling point, then when the dimensional correction function value for the sampling point A is to be calculated, a high weight is applied to the region of the central punched line L2 while a low weight is applied to the regions of the line L1 and the line L3. Then, when correction is to be performed with regard to the line L1 or the line L3, the weight to the pattern region of the line L1 or the line L3 itself is set to a comparatively high value while the weight to the other pattern regions is set to a comparatively low value. In other words, the region of the rectangle same as the sampling point is decided as a region in which reaction products which can have an influence on the sampling point are produced, and a comparatively high weight is applied to the region.

Figure 3:
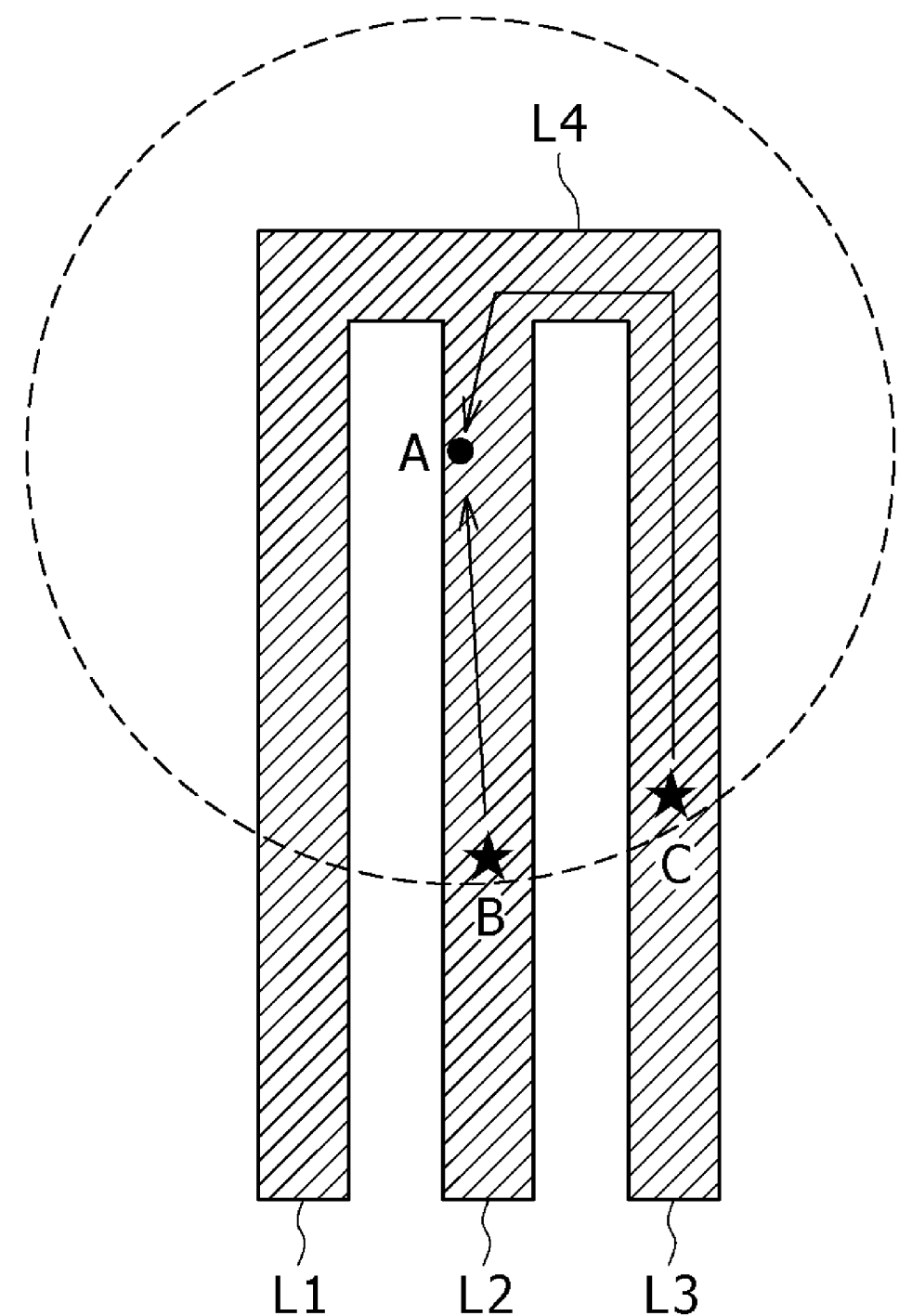
FIG. 3 is a schematic view showing another particular example of a punched line pattern of a metal layer or the like to be used to form a semiconductor circuit.

FIG. 3 shows another particular example of the punched line pattern and particularly shows a pattern shape which includes a bent portion. Referring to FIG. 3, in the pattern shape having a bent portion, the point C of the line L3 belongs to a pattern region same as that of the point A of the line L2. However, in order for reaction products produced at the point C to come and stick to the point A, it is necessary for them to move along a roundabout route L4 which interconnects the line L3 and the line L2 as indicated by arrow marks in FIG. 3. Therefore, reaction products produced at the point C stick to a side wall on the way with a high degree of possibility before they come to the point A. Consequently, it may not be considered that they stick to the point A with an equal probability to that of reaction products produced at the point B of the line L2. Therefore, where such a pattern shape as seen in FIG. 3 is used, the weighting should be performed not such that it is performed individually for different pattern regions (rectangular regions) as in the case of the LS pattern described hereinabove with reference to FIGS. 1A and 1B, but in the following manner. In particular, with regard to individual directions around the sampling point, a region surrounded by the most proximate pattern edges to the sampling point is decided as a region in which reaction products which have an influence on the sampling point are produced, and the weighting is performed such that a high weight is applied to the region while a low weight is applied to the other regions.

Figure 4:
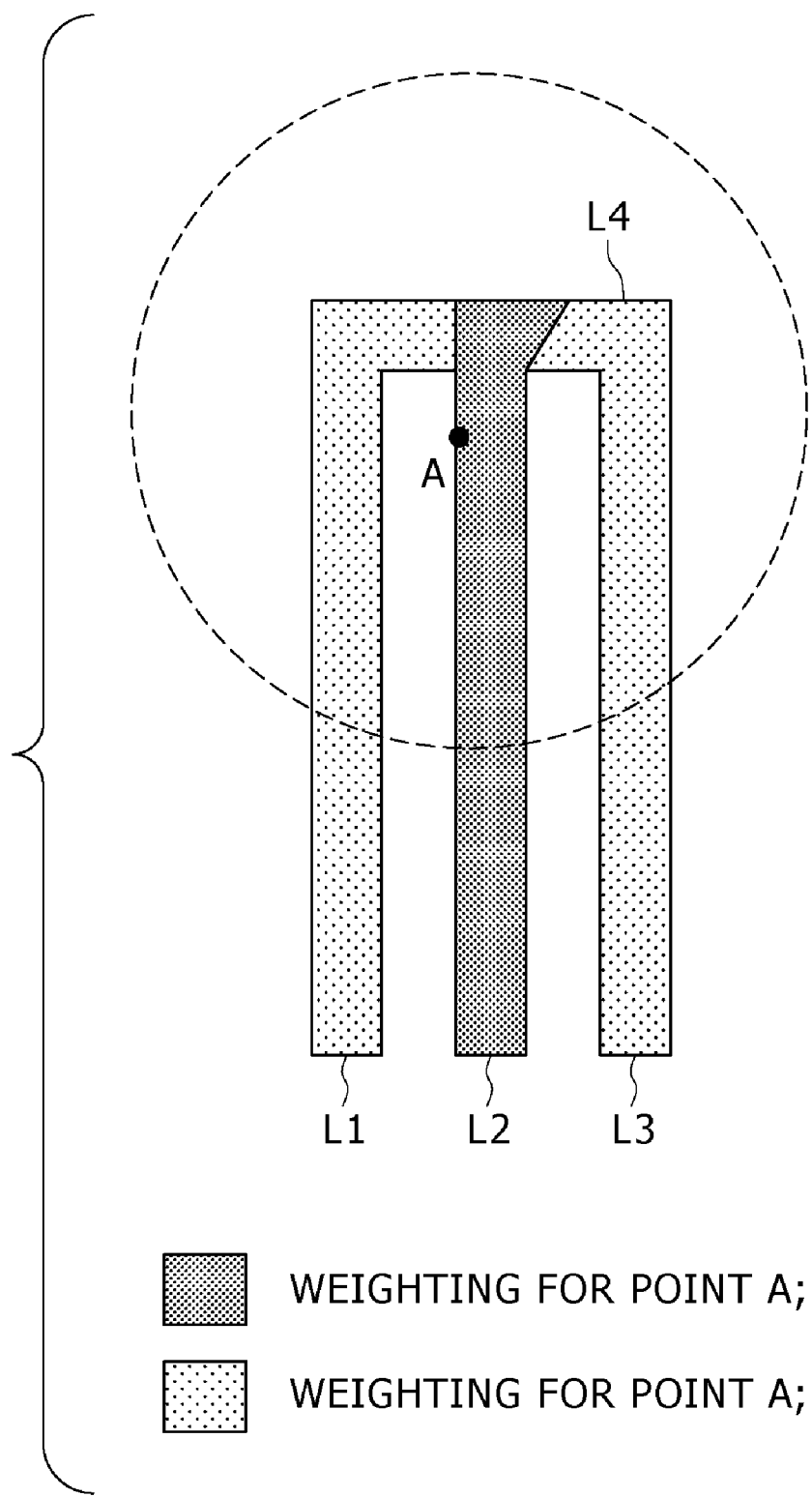
FIG. 4 is a schematic view illustrating an outline of weighting for the punched line pattern of FIG. 3.

FIG. 4 illustrates another particular example of an outline of weighting and particularly illustrates an example of weighting for the pattern shape shown in FIG. 3 which includes a bent portion. Referring to FIG. 4, in the pattern shape having a bent portion, if the point A is set as a sampling point, then when a dimensional correction function value at the sampling point A is to be calculated, the pattern edge distribution around the point A is taken into consideration to extract a region surrounded by the most proximate pattern edges to the point A in all directions around the point A. Then, regarding the region as a region into which reaction products diffuses with a high probability, the region is decided as an integration object region of the surrounding area and a comparatively high weight is applied to the region while a comparatively low weight is applied to the other pattern regions. In other words, a region surrounded by the most proximate pattern edges to the sampling point, that is, a region on the inner side of the most proximate pattern edges, is decided as a region in which reaction products which have an influence on the sampling point are produced, and a comparatively high weight is applied to the region.

It is to be noted that, in FIG. 2 or 4 which illustrates a particular example of weighting, a circle centered at the sampling point A represents an influence radius on the point A. Accordingly, the area density value may be calculated within the area of the influence radius.

Further, in the particular example shown in FIG. 2 or 4, where a design pattern is a punched line, that is, an etching object region is a polygonal region and the polygonal region is decided as a pattern region of an integration object. However, also where a line portion is to be left by gate layer working or the like, weighting may be performed in a quite similar manner of thinking. Where a line portion is to be left, since an etching object region does not have a polygonal shape, calculation of an area density value is performed with regard to the non-polygonal region and the non-polygonal region of the design pattern is used as a pattern region of an integration object. In short, even where a line portion is to be left, a high weight is applied to a region in which a large number of reaction products which are likely to come to the sampling point are produced, but a comparatively low weight is applied to any other region.

In order to introduce such weighting as described above, the value of a variable for the weighting is determined empirically through an experiment based on a test pattern, a simulation or the like in response to the peripheral pattern edge distribution around each sampling point. Also it is possible to set the variable to 1 for the inner side of the pattern edges in all directions from each sampling point but set the value to 0 to the outer side of the pattern edges. If an influence radius can be determined from an experiment or the like, then the weighting variable may be defined within the influence radius from each sampling point.

In particular, an influence of weighting may be reflected on a calculation result of correction calculation according to the model-based OPC in the following manner.

In general model-based OPC, an energy function value or a peripheral pattern area density value (since they have the same significance, merely the latter term, that is, "peripheral pattern area density value", is used hereinbelow) is used as an argument in a function for the correction calculation, and an integration kernel produced arbitrarily and a peripheral pattern distribution are integrated to calculate the peripheral pattern area density value. In particular, a peripheral pattern area density function E at the sampling point A is represented, where the integration kernel is represented by K and the pattern distribution is represented by P, as given by the following expression (1):

$$E(r_A) = \iint K(r_A - r) \times P(r) dr \quad (1)$$

In order to reflect an influence of weighting on a result of the calculation, such measures may be taken that a peripheral region around the sampling point is divided into a plurality of regions and a variable representative of a weighting influence degree of each region is introduced and used for multiplication upon calculation of the peripheral pattern area density value. More particularly, where the variable representative of the influence degree from a region i (i=1, . . . , m) when the peripheral region around the sampling point A is divided into m regions, that is, the weighting influence degree of each region, is represented by $\beta(r_A, i)$, the peripheral pattern area density function E' which varies the weight for each region is represented by the following expression (2):

$$E'(r_A) = \sum_{i}^{n} \left[ \beta(r_A, i) \iint_{region(i)} K(r_A - r_i) \times P(r_i) dr_i \right] \quad (2)$$

On the other hand, the influence of weighting may be reflected on a result of calculation of the peripheral pattern area density value alternatively by introducing a continuous function representative of the weighting influence degree of peripheral regions around a sampling point and using such weighting influence degree values for multiplication upon calculation of the peripheral pattern area density value. More particularly, if weighting of peripheral regions is to be performed in a continuous distribution, then the peripheral pattern area density function E" for varying the weight for each region is represented, where the continuous function representative of the weighting influence degree of peripheral regions is represented by $\beta(r_A, r)$, by the following expression (3):

$$E''(r_A) = \iint \beta(r_A, r) \times K(r_A - r) \times P(r) dr \quad (3)$$

It is to be noted that the peripheral pattern area density value calculated using any of the expressions (2) and (3) given above may be used arbitrarily in any manner for dimensional correction of a design pattern. For example, it is possible to use the peripheral pattern area density value to perform a fixed threshold method or a variable threshold method in order to calculate a pattern edge as in the related art or to use the peripheral pattern area density value to perform repetitive calculation upon correction of a design pattern.

By performing correction calculation into which such weighting with a two-dimensional distribution of pattern edges around a sampling point into consideration as described above is introduced, even where different pattern edges are located at the same distance from the sampling point, different weights are applied depending upon the situation of the two-dimensional distribution of the pattern edges. In other words, the flexibility can be provided to the influence degree from a pattern or a region located at the same distance from the sampling point. Accordingly, optimization of a correction parameter for correcting a dimensional dispersion of patterns, shape distortion and so forth by a process proximity effect such as, for example, an etching work conversion difference, which is difficult to achieve using correction calculation based on model-based OPC in the past, can be achieved.

In particular, if weighting with a peripheral pattern edge distribution around a sampling point taken into consideration is introduced, then correction against both of an optical proximity effect and a process proximity effect can be performed simultaneously and with a high degree of accuracy by the two-dimensional model-based OPC. Therefore, even if a design pattern is for a large scale integrated circuit pattern, the long period of time necessary for correction calculation can be eliminated. More particularly, since process proximity effect correction is carried out by the two-dimensional model-based OPC while weighting with a situation of a two-dimensional distribution of pattern edges into consideration is introduced, correction calculation with a high degree of accuracy can be anticipated when compared with a case in the past wherein rule-based process proximity effect correction is carried out based on one-dimensional dimensions such as a line width and a space width. Further, since optical proximity effect correction and process proximity effect correction can be carried out simultaneously using a single model-based OPC calculation expression, also reduction of the calculation time can be anticipated when compared with an alternative case wherein rule-base optical proximity effect correction and model-based optical proximity effect correction are carried out successively as in the related art.

Accordingly, if the pattern correction according to the model-based OPC described hereinabove is carried out, then a higher degree of accuracy of formation dimensions of a semiconductor circuit pattern can be anticipated and hence enhancement of the yield in semiconductor fabrication can be anticipated. Further, since a correction process for the pattern correction can be executed at a high speed, also decrease of the time for delivery of products can be anticipated. Furthermore, two-dimensional correction and management of a final shape, dimensions and so forth of a semiconductor circuit pattern can be implemented readily, and consequently, also enhancement of basic performances of a semiconductor circuit such as reduction of leak current can be anticipated.

Particularly, where the expression (2) given hereinabove is used in order to reflect the influence of weighting on a result of calculation according to the model-based OPC, then since a variable representative of the weighting degree is introduced, the influence of weighting can be reflected readily as hereinafter described in connection with working examples of the present invention. On the other hand, where the expression (3) given hereinabove is used, since a continuous function representative of the weighting influence degree of peripheral regions, although the calculation load increases when compared with the alternative case wherein the expression (2) is used, since it is possible to cope also with continuous variation of the weighting degree, the correction accuracy can be enhanced when compared with the alternative case wherein the expression (2) is used.

Working Example 1

Now, a pattern correction apparatus, a pattern correction program, a pattern correction method and a fabrication method for a semiconductor device wherein the model-based OPC described above is carried out are described in connection with particular examples. Here, correction of an etching work conversion difference which may possibly occur in a metal layer working process at a drying etching step which is one of steps of a semiconductor device fabrication process is described.

Figure 5:
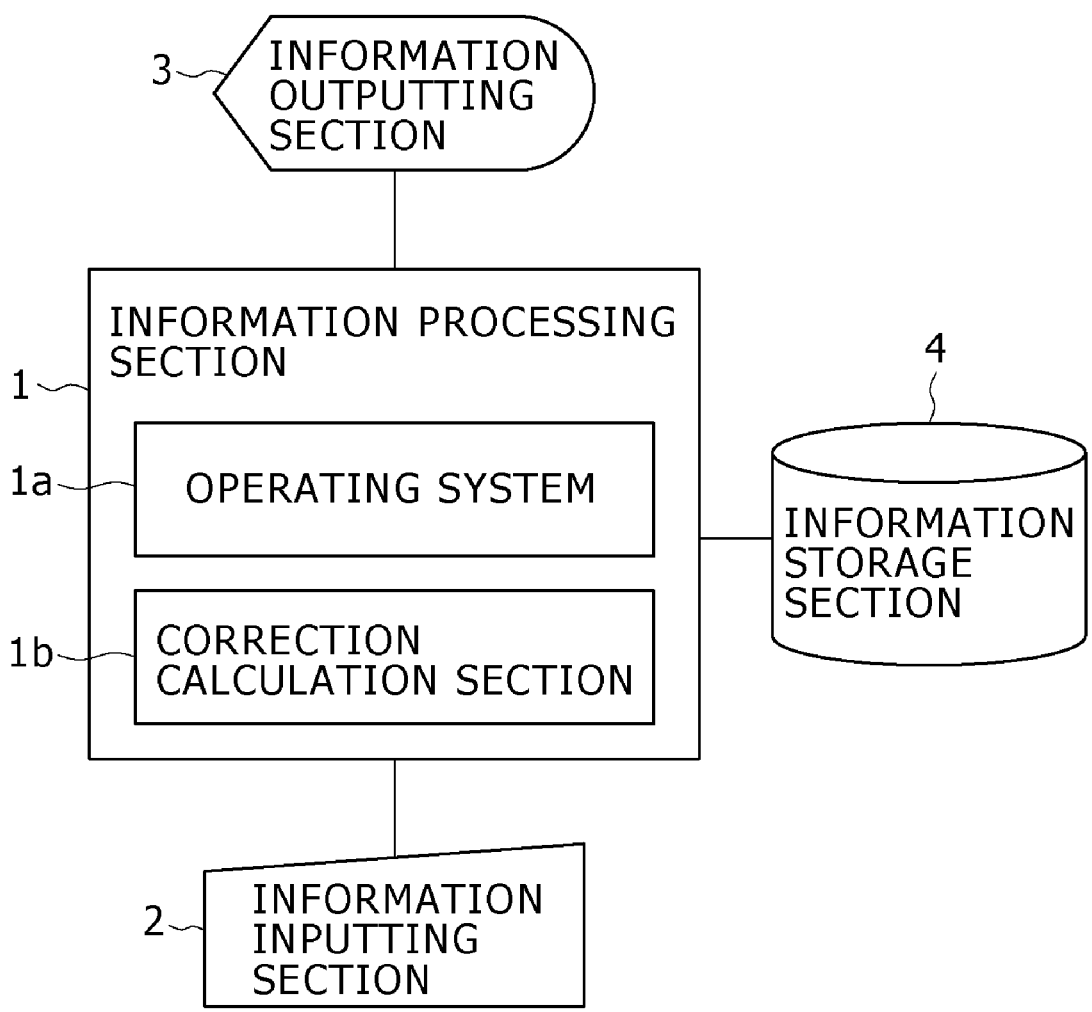
FIG. 5 is a block diagram showing a general configuration of a pattern correction apparatus to which the present invention is applied.

FIG. 5 is a block diagram showing an example of a general configuration of a pattern correction apparatus to which the present invention is applied. Referring to FIG. 5, the pattern correction apparatus includes an information processing section 1, an information inputting section 2, an information outputting section 3, and an information storage section 4. The information processing section 1 has functions as a computer which is implemented by a combination of a CPU (Central Processing Unit), a RAM (Random Access Memory) and so forth. The information inputting section 2 includes inputting apparatus such as a keyboard and a mouse for inputting information to the information processing section 1 and/or a communication interface with another apparatus such as, for example, a CAD apparatus. The information outputting section 3 includes a display apparatus and so forth for outputting a result of information processing by the information processing section 1 to a user of the pattern correction apparatus. The information storage section 4 includes a storage apparatus or the like for storing information as occasion demands. The information processing section 1 has a function as an operating system 1*a* for controlling operation of the entire pattern correction apparatus and another function as a correction calculation section 1*b* for performing correction calculation according to the model-based OPC described hereinabove.

The correction calculation section 1*b* implements the function of the information processing section 1 as a computer by executing a predetermined program. In this instance, the predetermined program may be stored in and provided as a computer-readable storage medium or may be distributed through wired or wireless communication means prior to installation into the pattern correction apparatus. The pattern correction apparatus according to the present working example may be implemented also by a pattern correction program which can be installed into the present pattern correction apparatus.

Where the pattern correction apparatus (including also a case wherein it is implemented by the pattern correction program) having such a configuration as described above is used to carry out pattern correction according to the model-based OPC, it is necessary to set parameters, conditions and so forth necessary for execution of the pattern correction prior to the pattern correction. Here, a series of processes for carrying out the pattern correction including setting of parameters, conditions and so forth, that is, the pattern correction method to which the present invention is applied, is described.

Figure 6:
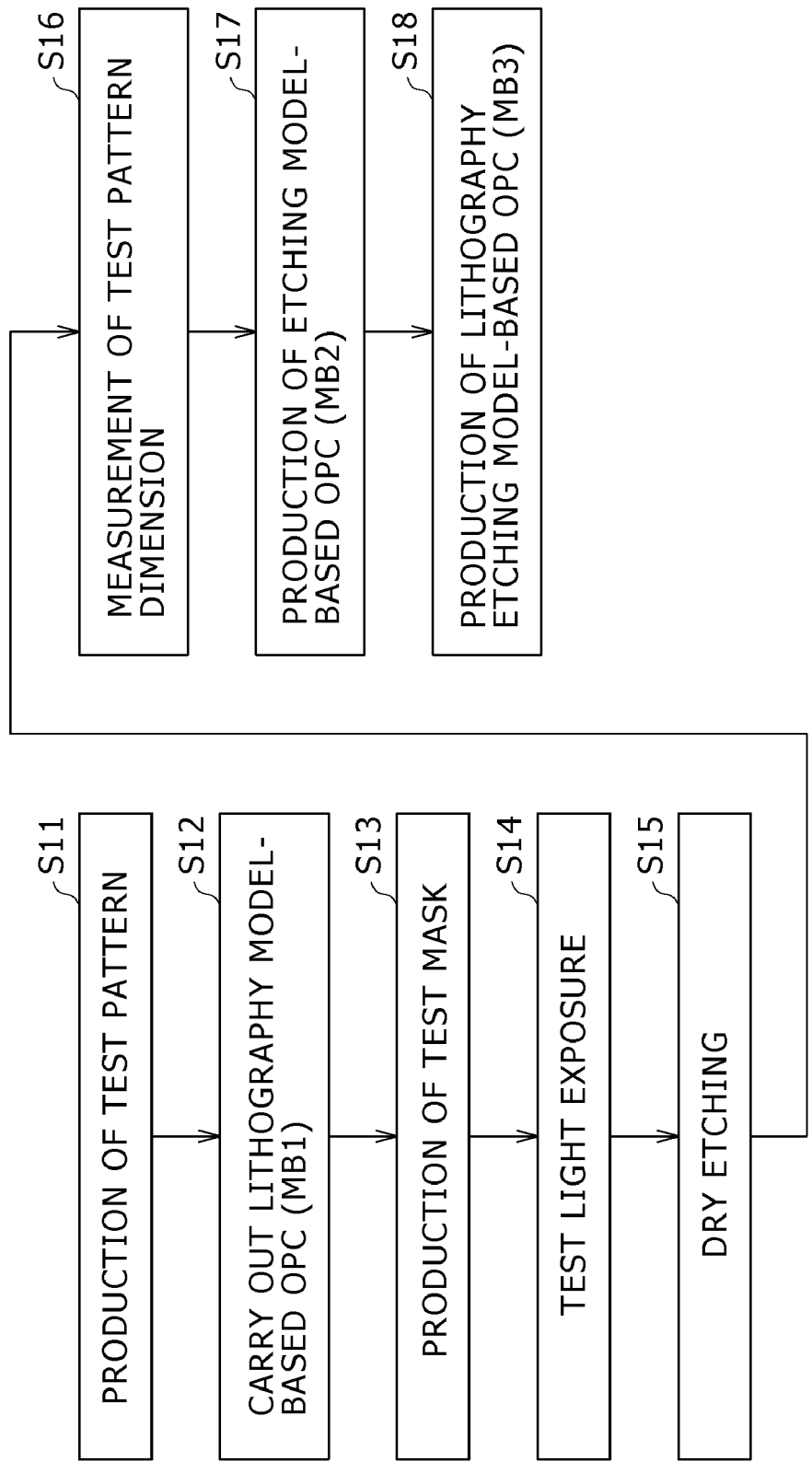
FIG. 6 is a flow chart illustrating a particular example of a pattern correction method to which the present invention is applied.

FIG. 6 illustrates a particular example of the pattern correction method to which the present invention is applied.

When pattern correction according to the model-based OPC is to be carried out using the pattern correction apparatus, in order to obtain experiment data of the etching work conversion difference, a design pattern (hereinafter referred to as design test pattern) which is used for various test patterns such as LS patterns, isolated patterns, hole patterns and butt patterns is produced and prepared first at step S11. This is because, in order to confirm the validity of the model base OPC, it is preferable to include not only a design test pattern which involves one-dimensional stepwise displacement of an LS pattern such as stepwise pitch movement but also a design test pattern which involves two-dimensional stepwise displacement of a shape distribution. In particular, it is considered that the number of design test patterns normally reaches several tens to several hundreds.

After the production of a design test pattern, an evaluation photomask having a mask pattern based on the design test pattern is produced. However, the evaluation photomask produced at this time is used to evaluate the process proximity effect. Accordingly, it is determined that the correction function against the optical proximity effect is known through a separate evaluation, and model-based OPC (MB1) of a lithography model is performed for the design test pattern (step S12). Then, after the model-based OPC (MB1) is carried out, production of an evaluation photomask is performed (step S13). Accordingly, it is considered that a resist test pattern which is exposed by test using the thus produced evaluation photomask is completed equally to the design test pattern.

After the evaluation photomask is produced, test exposure is performed using the evaluation photomask to produce a plurality of test wafers to which the resist pattern corresponding to the design test pattern is transferred (step S14). Further, dry etching is performed for several ones of the produced wafers (step S15) to produce test wafers worked corresponding to the resist pattern. It is assumed that the process recipe conditions upon such dry etching are settled in advance by a separate experiment. Then, the size of the same pattern portions is measured with regard to the test wafers before and after the drying etching and the difference between them is extracted (step S16). Consequently, data of the etching work conversion difference regarding various test patterns can be collected.

Thereafter, the collected data of the etching work conversion difference regarding such test patterns are used to optimize the correction parameter for the model-based OPC (step S17). At this time, weighting with such a two-dimensional distribution of pattern edges as described above into consideration is introduced.

Figure 7A:
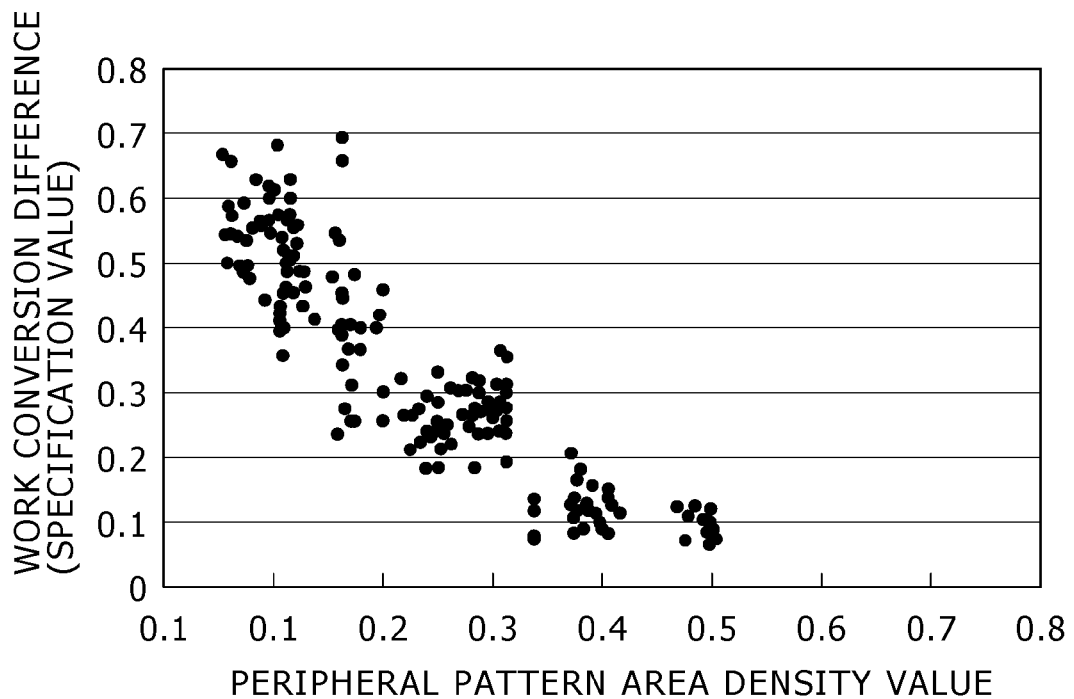
FIGS. 7A and 7B are diagrams illustrating particular examples (experimental data) of a correlation between an optimized peripheral pattern area density value of the model-based OPC and the etching work conversion difference.
Figure 7B:
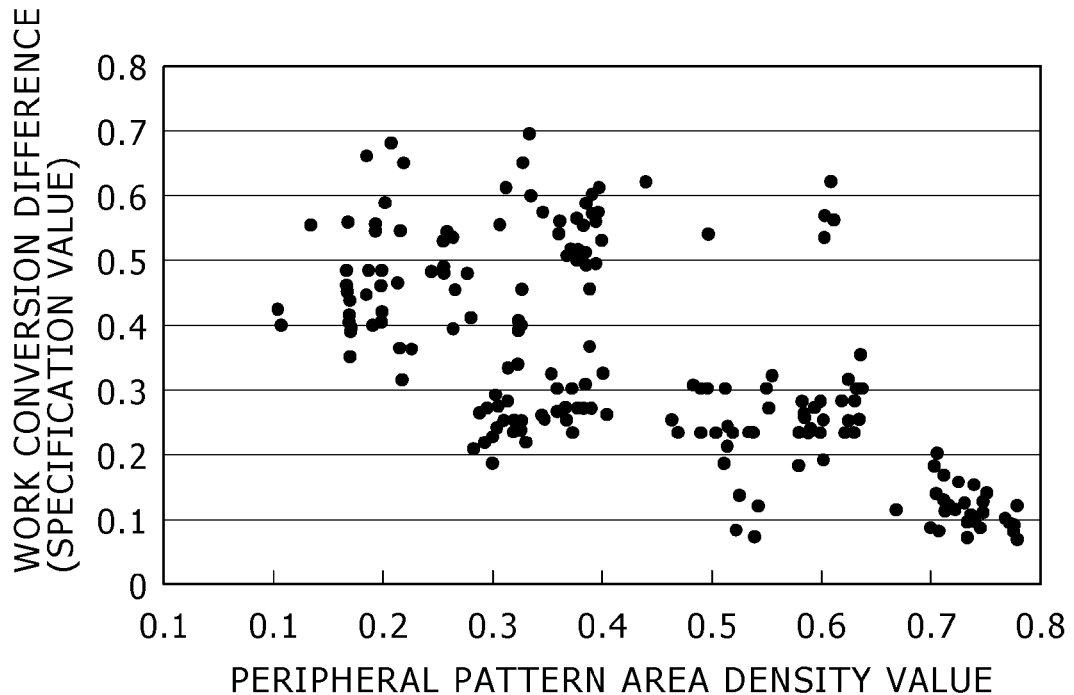

FIGS. 7A and 7B are diagrams illustrating particular examples (experiment data) of a correlation between the optimized peripheral pattern area density value of the model-based OPC and the etching work conversion difference. FIG. 7A illustrates a result where the weighting described above is introduced, and FIG. 7B illustrates a result by the related art technique where no weighting is introduced for comparison. More specifically, in both of FIGS. 7A and 7B, the axis of ordinate indicates normalized data of the etching work conversion difference. Meanwhile, the axis of abscissa in FIG. 7A indicates a result where the peripheral pattern area density value is calculated in accordance with the expression (2) given hereinabove while the axis of abscissa in FIG. 7B indicates a result where the peripheral pattern area density value is calculated in accordance with the expression (1) given hereinabove.

Further, in the example of FIG. 7A, after the entire design test pattern is divided into grid regions of 5 nm square, those grid regions which are on the outer side of the most proximate pattern edges are excepted from the area density calculation assuming that reaction products do not come from the outside of the most proximate pattern edges. In other words, the weight for the inner side of the pattern edges is set to "1" while the weight for the outer side of the pattern edges is set to "0". It is to be noted that, for the integration kernel, a Gaussian function of a radius of 600 nm (the Gaussian function is a function having a form of an exponential function and is defined such that the amplitude attenuates as the distance from the origin increases) is used with regard to both of FIGS. 7A and 7B.

From the results illustrated in FIGS. 7A and 7B, it can be recognized that the work conversion difference decreases as the peripheral pattern area density value increases. This is because, as the peripheral pattern area density value increases, an increasing number of reaction produces are produced and stick to pattern side walls. However, where the dispersions of data in the cases of FIGS. 7A and 7B are compared with each other, it can be recognized that the dispersion in the case of FIG. 7A is smaller than the dispersion in the case of FIG. 7B. This is because, where the weighting with a pattern edge distribution taken into consideration is introduced, a higher correlativity is had on the work conversion difference. Accordingly, if a model-based OPC correction function (MB2) is constructed using a peripheral pattern area density value calculated by introduction of the weighting with the pattern edge distribution into consideration as an argument, then it can be expected that the etching work conversion difference can be corrected with a higher degree of accuracy than ever.

Then, after the correction parameter of the model-based OPC is optimized to construct the model-based OPC correction function (MB2), the optical proximity effect correction function (MB1) used at step S12 and the process proximity effect correction function (MB2) optimized at step S17 are combined to produce a model-based OPC function (MB3) which can be used for correction against both of the optical proximity effect and the process proximity effect simultaneously and with a high degree of accuracy (step S18). An arbitrary technique may be used for the technique for combining the two functions (MB1 and MB2) in this instance. In other words, a known technique may be used suitably, but specific technique is not limited.

It is to be noted that such a series of processes as described above are performed by the information processing section 1 of the pattern correction apparatus except such processes as mask production, light exposure and etching. Further, where a pseudo-simulation is performed without actually producing evaluation photomasks and test wafers, the series of processes described above is performed by the information processing section 1 of the pattern correction apparatus.

Now, a fabrication method of a semiconductor device which makes use of such a pattern correction method as described above is described.

FIG. 8 is a flow chart illustrating a particular example of the fabrication method for a semiconductor device to which the present invention is applied.

Referring to FIG. 8, upon fabrication of a semiconductor device, a design pattern (hereinafter referred to as "design device pattern") to be used to form a semiconductor circuit pattern which composes the semiconductor device is inputted to the pattern correction apparatus making use of the information inputting section 2 (step S21). At this time, in the pattern correction apparatus, the information processing section 1 carries out OPC using the lithography etching model-based OPC function (MB3) produced through the above-described series of processes (particularly, step S18 in FIG. 6) for the inputted design device pattern (step S22). Consequently, for the design device pattern, correction against both of the optical proximity effect and the process proximity effect is carried out simultaneously using the single model-based OPC function. Therefore, the processing time decreases when compared with the case in the past wherein the rule-base OPC and the model-based OPC are carried out successively. Besides, since the model-based correction against the process proximity effect is carried out using a two-dimensional pattern shape as input data, also enhancement of the accuracy of correction calculation can be achieved when compared with the case in the past wherein rule-base correction of the process proximity effect is carried out based on one-dimensional dimensions such as a line width and a space width.

After such OPC as described above is carried out, an exposure mask is produced based on the design device pattern after the OPC (step S23), and a resist pattern corresponding to the design device pattern is transferred to the wafer by exposure using the exposure mask. Then, dry-etching is executed to the wafer (step S25). Then, a wafer for which silicon working is performed for a circuit pattern (hereinafter referred to as "silicon device pattern") corresponding to the resist pattern is produced (step S26). Consequently, a semiconductor device of the silicon device pattern having a high fidelity to the design device pattern is fabricated. In other words, since the dimensional accuracy of the silicon device pattern enhances, the yield increases, and reduction of the time for the OPC correction process results in reduction of the time for delivery of products. Furthermore, since a final pattern shape, size and so forth of a silicon device pattern (semiconductor circuit pattern) can be corrected and managed two-dimensionally, enhancement of basic performances of a semiconductor device such as reduction of leak current can be implemented.

It is to be noted that, while the preferred embodiment of the present invention is described above, the present invention is not restricted to the particulars of the embodiment but can be carried out in various modified forms without departing from the spirit and scope of the present invention. For example, in the embodiment described above, an etching work conversion difference which may possibly appear in a metal layer working process at a dry etching step which is one of steps of a semiconductor device fabrication process is corrected. However, the present invention can be applied quite similarly also to a case wherein an etching work conversion difference which appears at a dry etching step than an insulating film working process of a metal layer or also to another case wherein a pattern dimension dispersion which appears not at a dry etching process but at a resist slimming step or a CMP step is corrected.

What is claimed is:

1. A pattern correction apparatus for performing proximity effect correction with regard to a design pattern, said apparatus comprising:
   an information inputting section;
   a correction calculation section; and
   an information outputting section,
   wherein, said correction calculation section:
      performs optical proximity effect correction by calculating a two-dimensional model-based optical proximity effect correction for each of a plurality of sampling points set on at least one pattern edge which forms the design pattern;
      performs process proximity effect correction calculation by weighting with a two-dimensional distribution of the pattern edge around each said sampling point; said weighting being performed such that a high weight is applied to a region in which reaction products which can have an influence on the sampling point but a low weight is applied to any other region, and
      uses, in a function to be used for the correction calculation by the two-dimensional model-based optical proximity effect correction, a peripheral pattern area density value as an argument and integrates an integration kernel produced arbitrarily and a peripheral pattern distribution to calculate the peripheral pattern area density value, and then reflects an influence of the weighting on a result of the calculation.

2. The pattern correction apparatus according to claim 1, wherein the region in which reaction products which can have an influence on the sampling point are produced is within a rectangular region which includes the sampling point.

3. The pattern correction apparatus according to claim 1, wherein the region in which reaction products which can have an influence on the sampling point are produced is surrounded by the most proximate pattern edges from the sampling point with regard to different directions around the sampling point.

4. The pattern correction apparatus according to claim 1, wherein the influence of the weighting is reflected on the result of the calculation of the peripheral pattern area density value by dividing a peripheral region around the sampling point into a plurality of regions and introducing a variable representative of a weighting influence degree for each region and then using the variable for multiplication upon calculation of the peripheral pattern area density value.

5. The pattern correction apparatus according to claim 1, wherein the influence of the weighting is reflected on the result of the calculation of the peripheral pattern area density value by introducing a continuous function representative of a weighting influence degree of a peripheral region around the sampling point and using the continuous function for multiplication of the peripheral pattern area density value.

6. A computer-readable storage device storing a pattern correction program for performing proximity effect correction with regard to a design pattern, said pattern correction program causing a computer to perform the steps of:
   performing optical proximity effect correction by calculating a two-dimensional model-based optical proximity effect correction for each of a plurality of sampling points set on at least one pattern edge which forms the design pattern;
   performing process proximity effect correction calculation by weighting with a two-dimensional distribution of the pattern edge around each sampling point; said weighting being performed such that a high weight is applied to a region in which reaction products which can have an influence on the sampling point are produced but a low weight is applied to any other region,
   wherein:
      said step of performing optical proximity effect correction uses, in a function to be used for the correction calculation by the two-dimensional model-based optical proximity effect correction, a peripheral pattern area density value as an argument and integrates an integration kernel produced arbitrarily and a peripheral pattern distribution to calculate the peripheral pattern area density value, and then reflects an influence of the weighting on a result of the calculation.

7. A pattern correction method for performing proximity effect correction with regard to a design pattern, said method comprising the steps of:
   performing optical proximity effect correction by calculating a two-dimensional model-based optical proximity effect correction for each of a plurality of sampling points set on at least one pattern edge which forms the design pattern;
   performing process proximity effect correction calculation by weighting with a two-dimensional distribution of the pattern edge around each sampling point; said weighting being performed such that a high weight is applied to a region in which reaction products which can have an influence on the sampling point are produced but a low weight is applied to any other region,
   wherein:
      said step of performing optical proximity effect correction uses, in a function to be used for the correction calculation by the two-dimensional model-based optical proximity effect correction, a peripheral pattern area density value as an argument and integrates an integration kernel produced arbitrarily and a peripheral pattern distribution to calculate the peripheral pattern area density value, and then reflects an influence of the weighting on a result of the calculation using a computer.

8. A fabrication method for a semiconductor device, comprising the steps of:
   performing optical proximity effect correction by calculating two-dimensional model-based optical proximity effect correction for each of a plurality of sampling points set on at least one pattern edge which forms a design pattern to be used to form a semiconductor circuit pattern;
   performing process proximity effect correction calculation by weighting with a two-dimensional distribution of the pattern edge around each sampling point;
   said weighting being performed such that a high weight is applied to a region in which reaction products which can have an influence on the sampling point are produced but a low weight is applied to any other region; and forming said semiconductor circuit pattern after performing both the optical proximity effect correction and the process proximity effect correction,
wherein:
said step of performing optical proximity effect correction uses, in a function to be used for the correction calculation by the two-dimensional model-based optical proximity effect correction, a peripheral pattern area density value as an argument and integrates an integration kernel produced arbitrarily and a peripheral pattern distribution to calculate the peripheral pattern area density value, and then reflects an influence of the weighting on a result of the calculation using a computer.

* * * * *